United States Patent
Zhao et al.

(10) Patent No.: US 10,108,489 B2
(45) Date of Patent: *Oct. 23, 2018

(54) SYSTEMS AND METHODS FOR EFFICIENT SOFT DATA BASED FLASH MEMORY DATA RECOVERY

(71) Applicant: Avago Technologies General IP (Singapore) Pte. Ltd., Singapore (SG)

(72) Inventors: Zhijun Zhao, Fremont, CA (US); Shaohua Yang, San Jose, CA (US); Victor Krachkovsky, Allentown, PA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 85 days.

This patent is subject to a terminal disclaimer.

(21) Appl. No.: 14/925,714

(22) Filed: Oct. 28, 2015

(65) Prior Publication Data

US 2017/0123899 A1    May 4, 2017

(51) Int. Cl.
| | |
|---|---|
| *G11C 29/00* | (2006.01) |
| *G06F 11/10* | (2006.01) |
| *G11C 29/52* | (2006.01) |
| *G11C 16/26* | (2006.01) |
| *G11C 16/10* | (2006.01) |
| *G11C 7/10* | (2006.01) |
| *H03M 7/00* | (2006.01) |
| *H03M 13/11* | (2006.01) |
| *H03M 13/00* | (2006.01) |
| *G11C 11/56* | (2006.01) |

(52) U.S. Cl.
CPC ........ *G06F 11/1068* (2013.01); *G11C 7/1006* (2013.01); *G11C 11/5628* (2013.01); *G11C 11/5642* (2013.01); *G11C 16/10* (2013.01); *G11C 16/26* (2013.01); *G11C 29/52* (2013.01); *H03M 7/00* (2013.01); *H03M 13/1111* (2013.01); *H03M 13/6325* (2013.01); *H03M 13/6588* (2013.01)

(58) Field of Classification Search
CPC ............. G06F 11/1072; G06F 11/1068; G06F 2212/401; G06F 2212/403; G06F 11/1044; H03M 13/1102; H03M 13/1111; G11C 29/52; G11C 16/26; G11C 16/08; G11C 16/10; G11C 11/5642; G11C 11/5685; G11C 29/021; G11C 29/028; G11C 29/78; G06N 99/005

See application file for complete search history.

(56) References Cited

U.S. PATENT DOCUMENTS

| | | | |
|---|---|---|---|
| 8,014,196 | B2 | 9/2011 | Graef |
| 8,065,583 | B2 | 11/2011 | Radke |
| 8,443,267 | B2 * | 5/2013 | Zhong ................ H03M 13/1108 714/780 |

(Continued)

OTHER PUBLICATIONS

U.S. Appl. No. 14/925,688, filed Oct. 28, 2015, Zhao.

(Continued)

*Primary Examiner* — Guerrier Merant
(74) *Attorney, Agent, or Firm* — Sheridan Ross P.C.

(57) ABSTRACT

Embodiments are related to systems and methods for data storage, and more particularly to systems and methods for storing and accessing data from a flash memory.

20 Claims, 8 Drawing Sheets

(56) References Cited

U.S. PATENT DOCUMENTS

| | | | |
|---|---|---|---|
| 8,694,854 B1* | 4/2014 | Dar | G11C 11/5642 |
| | | | 714/752 |
| 8,867,268 B2 | 10/2014 | Yang et al. | |
| 8,947,929 B1 | 2/2015 | Yang | |
| 9,037,431 B2 | 5/2015 | Lee et al. | |
| 9,106,264 B2 | 8/2015 | Alhussein et al. | |
| 9,124,300 B2 | 9/2015 | Sharon et al. | |
| 9,214,965 B2 | 12/2015 | Fitzpatrick et al. | |
| 9,286,155 B1 | 3/2016 | Low | |
| 9,337,866 B2* | 5/2016 | Gasanov | H03M 13/1111 |
| 9,450,610 B1 | 9/2016 | Micheloni et al. | |
| 2007/0044006 A1* | 2/2007 | Yang | G11B 20/1833 |
| | | | 714/785 |
| 2008/0151621 A1* | 6/2008 | Kong | G11C 11/5628 |
| | | | 365/185.03 |
| 2008/0288849 A1 | 11/2008 | Park et al. | |
| 2009/0234792 A1* | 9/2009 | Kim | G06N 99/005 |
| | | | 706/50 |
| 2009/0248952 A1 | 10/2009 | Radke et al. | |
| 2010/0034018 A1* | 2/2010 | Yang | G11C 11/5642 |
| | | | 365/185.2 |
| 2010/0165730 A1* | 7/2010 | Sommer | G06F 11/1068 |
| | | | 365/185.03 |
| 2011/0167305 A1 | 7/2011 | Haratsch et al. | |
| 2011/0246855 A1 | 10/2011 | Cheng et al. | |
| 2012/0079351 A1 | 3/2012 | Cideciyan et al. | |
| 2013/0024605 A1* | 1/2013 | Sharon | G06F 11/1072 |
| | | | 711/103 |
| 2013/0073798 A1 | 3/2013 | Kang et al. | |
| 2013/0182503 A1 | 7/2013 | Liu | |
| 2014/0208189 A1* | 7/2014 | Parthasarathy | H03M 13/13 |
| | | | 714/780 |
| 2014/0281800 A1 | 9/2014 | Micheloni et al. | |
| 2015/0243351 A1 | 8/2015 | Moschiano et al. | |
| 2015/0256291 A1* | 9/2015 | Shin | H04L 1/0042 |
| | | | 375/295 |
| 2016/0173228 A1* | 6/2016 | Shin | H04L 1/0042 |
| | | | 714/776 |
| 2016/0218740 A1 | 7/2016 | Parthasarathy et al. | |
| 2016/0285663 A1* | 9/2016 | Choi | H04H 20/33 |
| 2017/0046220 A1 | 2/2017 | Sharon et al. | |
| 2017/0123900 A1* | 5/2017 | Zhao | G06F 11/1068 |
| 2017/0123901 A1* | 5/2017 | Zhao | G06F 11/1068 |
| 2017/0123906 A1* | 5/2017 | Karabed | G06F 11/1072 |

OTHER PUBLICATIONS

U.S. Appl. No. 14/925,755, filed Oct. 28, 2015, Zhao.
Official Action for U.S. Appl. No. 14/925,755, dated Jun. 29, 2017 12 pages.
Official Action for U.S. Appl. No. 14/925,755, dated Jan. 9, 2018 13 pages.
Official Action for U.S. Appl. No. 14/925,688, dated Jun. 29, 2017 13 pages.
Official Action for U.S. Appl. No. 14/925,688, dated Jan. 11, 2018.
Notice of Allowance for U.S. Appl. No. 14/925,726, dated Apr. 18, 2017 9 pages.

* cited by examiner

SYSTEMS AND METHODS FOR EFFICIENT SOFT DATA BASED FLASH MEMORY DATA RECOVERY

FIELD OF THE INVENTION

Embodiments are related to systems and methods for data storage, and more particularly to systems and methods for storing to and accessing data from a flash memory.

BACKGROUND

To increase density in a flash memory device, multi-level cells are used. Such multi-level cells may be, for example, programmed to with one of four voltage levels with each of the four voltage levels representing a two bit binary value. When reading such a multi-level cell, a read back voltage is compared with a center voltage threshold to determine the least significant bit of the two bit binary value and additional comparisons are performed with an upper voltage threshold and a lower voltage threshold to determine the most significant bit of the two bit binary value. Use of multiple comparisons to yield the two bit binary value results in considerable latency.

Hence, for at least the aforementioned reasons, there exists a need in the art for advanced systems and methods for storing to and accessing data from a flash memory.

SUMMARY

Embodiments are related to systems and methods for data storage, and more particularly to systems and methods for storing to and accessing data from a flash memory.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment or one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
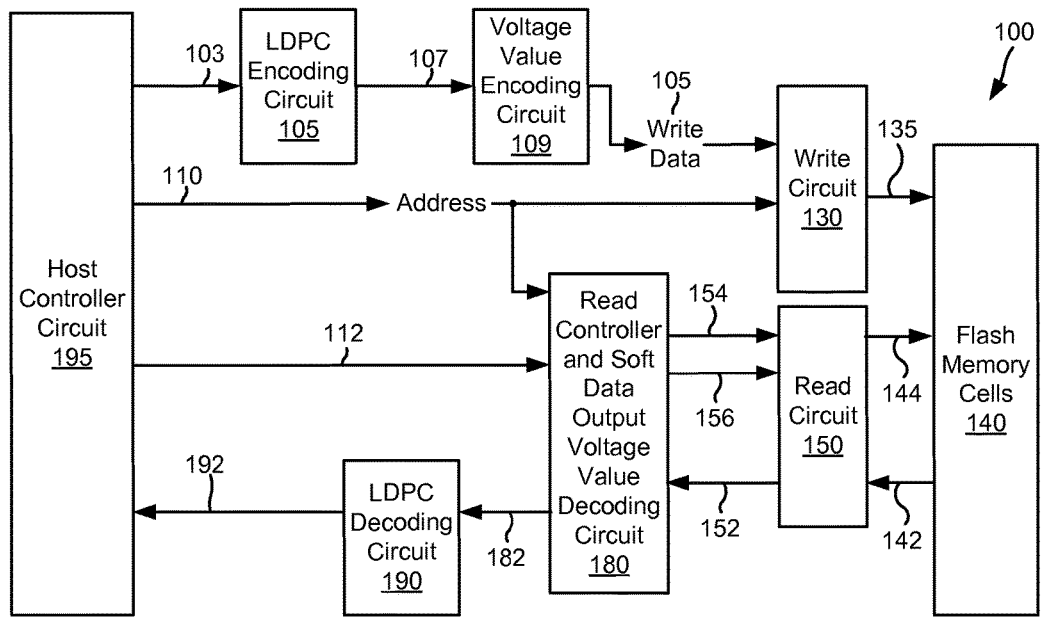
FIG. 1 shows a solid state storage system including soft data output voltage value decoding circuitry in accordance with some embodiments of the present invention.

Embodiments are related to systems and methods for data storage, and more particularly to systems and methods for storing to and accessing data from a flash memory.

Various embodiments of the present invention provide systems for accessing a flash memory device. The systems include: a data read circuit, a first data decoding circuit, and a second data decoding circuit. The data read circuit is operable to compare voltages read from a set of M groups of N flash memory cells with a first threshold value to yield a binary output set, where M and N are integers. The binary output set includes a set of M groups of N binary values. The first data decoding circuit is operable to generate at least a first set of M soft data values each corresponding to a respective one of the M groups of N binary values. The second data decoding circuit operable to decode the first set of M soft data values to yield a data output. In some instances of the aforementioned embodiments, the system is implemented as part of an integrated circuit. In various instances of the aforementioned embodiments, the first set of M soft data values corresponds to a low density parity check codeword, and the second data decoding circuit is a low density parity check decoding circuit.

In some instances of the aforementioned embodiments, the binary output set is a first binary output set, and the data read circuit is further operable to compare voltages read from the set of M groups of N flash memory cells with a second threshold value to yield a second binary output set. In such instances, the first data decoding circuit is further operable to generate at least a second set of M soft data values each corresponding to a respective one of the M groups of N binary values, and a third set of M soft data values each corresponding to a respective one of the M groups of N binary values. In some such instances, the data output is a first data output, and the second data decoding circuit is further operable to: decode the second set of M soft data values to yield a second data output, and decode the third set of M soft data values to yield a third data output.

In one or more instances of the aforementioned embodiments, the binary output set is a first binary output set, the data read circuit is further operable to compare voltages read from the set of M groups of N flash memory cells with a second threshold value to yield a second binary output set, and to compare voltages read from the set of M groups of N flash memory cells with a third threshold value to yield a third binary output set. In such instances, the first data decoding circuit is further operable to: generate at least a second set of M soft data values each corresponding to a respective one of the M groups of N binary values based upon the second binary output set, and a third set of M soft data values each corresponding to a respective one of the M groups of N binary values based upon the second binary output set; and generate at least a fourth set of M soft data values each corresponding to a respective one of the M groups of N binary values based upon the third binary output set, and a fifth set of M soft data values each corresponding to a respective one of the M groups of N binary values based upon the second binary output set. In some such instances, the first set of M soft data values corresponds to a first low density parity check codeword, the second set of M soft data values corresponds to a second low density parity check codeword, the third set of M soft data values corresponds to a third low density parity check codeword, the fourth set of M soft data values corresponds to a fourth low density parity check codeword, and the fifth set of M soft data values corresponds to a fifth low density parity check codeword. In some cases, N is three and M is 4096. In various cases, the first data decoding circuit includes: a first look-up table including soft data values corresponding to the first binary output set generated based upon the first threshold; a second look-up table including soft data values corresponding to the second binary output set generated based upon the second threshold; and a third look-up table including soft data values corresponding to the third binary output set generated based upon the third threshold.

In various instances of the aforementioned embodiments, the system further includes: a first encoder circuit operable to apply a first encoding algorithm to a user data set to yield a number of the encoded codewords, wherein each of the number of encoded codewords includes M elements; a second encoder circuit operable to apply a second encoding algorithm to a combination of the first number of the encoded codewords to yield M sets of N voltage values; wherein each of the M sets of N voltage values represents corresponding elements of each of the number of the encoded codewords; and a write circuit operable to apply voltages indicated by each of the N voltage levels to respective ones of the flash memory cells.

Other embodiments provide methods for accessing a solid state memory device. The methods include: accessing a set of M groups of N flash memory cells to yield M sets of N voltages, wherein M and N are integers; comparing the M sets of N voltages with a first threshold value to yield M sets of N binary outputs; using a first data decoding circuit to generate at least a first set of M soft data values each corresponding to a respective one of the M sets of N binary outputs; and using a second data decoding circuit to decode the first set of M soft data values to yield a data output.

In some instances of the aforementioned embodiments, the M sets of N binary outputs is a first group of M sets of N binary outputs and the data output is a first data output. In some such cases, the methods further include: comparing the M sets of N voltages with a second threshold value to yield a second group of M sets of N binary outputs; using the first data decoding circuit to generate a second set of M soft data values and a third set of M soft data values where each of the M soft data values corresponds to a respective one of the M sets of N binary outputs in the second group of M sets of N binary outputs; and using the second data decoding circuit to: decode the second set of M soft data values to yield a second data output, and decode the third set of M soft data values to yield a third data output. In other such cases, the methods further include: comparing the M sets of N voltages with a second threshold value to yield a second group of M sets of N binary outputs; comparing the M sets of N voltages with a third threshold value to yield a third group of M sets of N binary outputs; using the first data decoding circuit to: generate a second set of M soft data values and a third set of M soft data values where each of the M soft data values corresponds to a respective one of the M sets of N binary outputs in the second group of M sets of N binary outputs; and generate a fourth set of M soft data values and a fifth set of M soft data values where each of the M soft data values corresponds to a respective one of the M sets of N binary outputs in the third group of M sets of N binary outputs; and using the second data decoding circuit to: decode the second set of M soft data values to yield a second data output; decode the third set of M soft data values to yield a third data output; decode the fourth set of M soft data values to yield a fourth data output; and decode the fifth set of M soft data values to yield a fifth data output.

Turning to FIG. 1, a solid state storage system 100 is shown that includes soft data output voltage value decoding circuitry in accordance with some embodiments of the present invention. Solid state storage system 100 includes a host controller circuit 195, a low density parity check encoding circuit 105, a voltage value encoding circuit 109, a write circuit 130, flash memory cells 140, a read circuit 150, a read controller and soft data output voltage value decoding circuit 180, and a low density parity check decoding circuit 190. Host controller circuit 195 directs read and write access to flash memory cells 140. Flash memory cells 140 may be NAND flash memory cells or another type of solid state memory cells as are known in the art.

A data write is effectuated when host controller circuit 195 provides input data 103 to low density parity check encoding circuit 105. Low density parity check encoding circuit 105 applies a low density parity check encoding algorithm to input data 103 to yield LDPC codewords 107. LDPC codewords 107 are provided to voltage value encoding circuit 109. Voltage value encoding circuit 109 applies multi-level cell encoding to a group of LDPC codewords 107 to yield write data 111. In some embodiments of the present invention, five LDPC codewords are encoded together to yield write data 111 that is directed to flash memory cells 140 that are written as two-bit cells. It should be noted that while the various embodiments are discussed in relation to using a low density parity check encoding/decoding algorithm, that other encoding/decoding algorithms known in the art may be used in accordance with other embodiments of the present invention.

Figure 2:
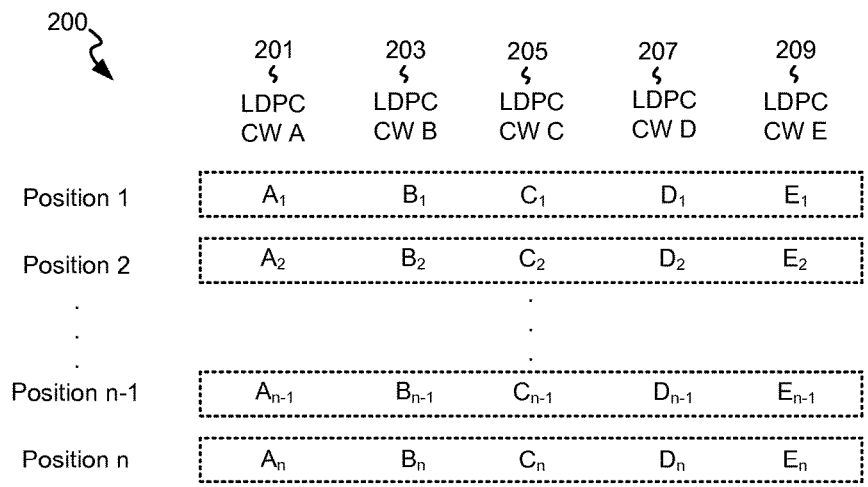
FIG. 2 shows an example of multi-level cell encoding using multiple low density parity check codewords in accordance with some embodiments of the present invention.

Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, . . . position n−1, and position n). It should be noted that an element (e.g., bit) of each of the respective codewords is found at each position. In some cases the element may be a filler value or an element from another codeword where a given codeword is shorter than another codeword. Thus, at position 1 a five bit word includes the first element of each of the five low density parity check codewords 201, 203, 205, 207, 209 (i.e., $\{A_1, B_1, C_1, D_1, E_1\}$). This is repeated for each of the positions 1 through n to yield n five bit words (i.e., $\{A_2, B_2, C_2, D_2, E_2\}$ . . . $\{A_n, B_n, C_n, D_n, E_n\}$).

Figure 3:
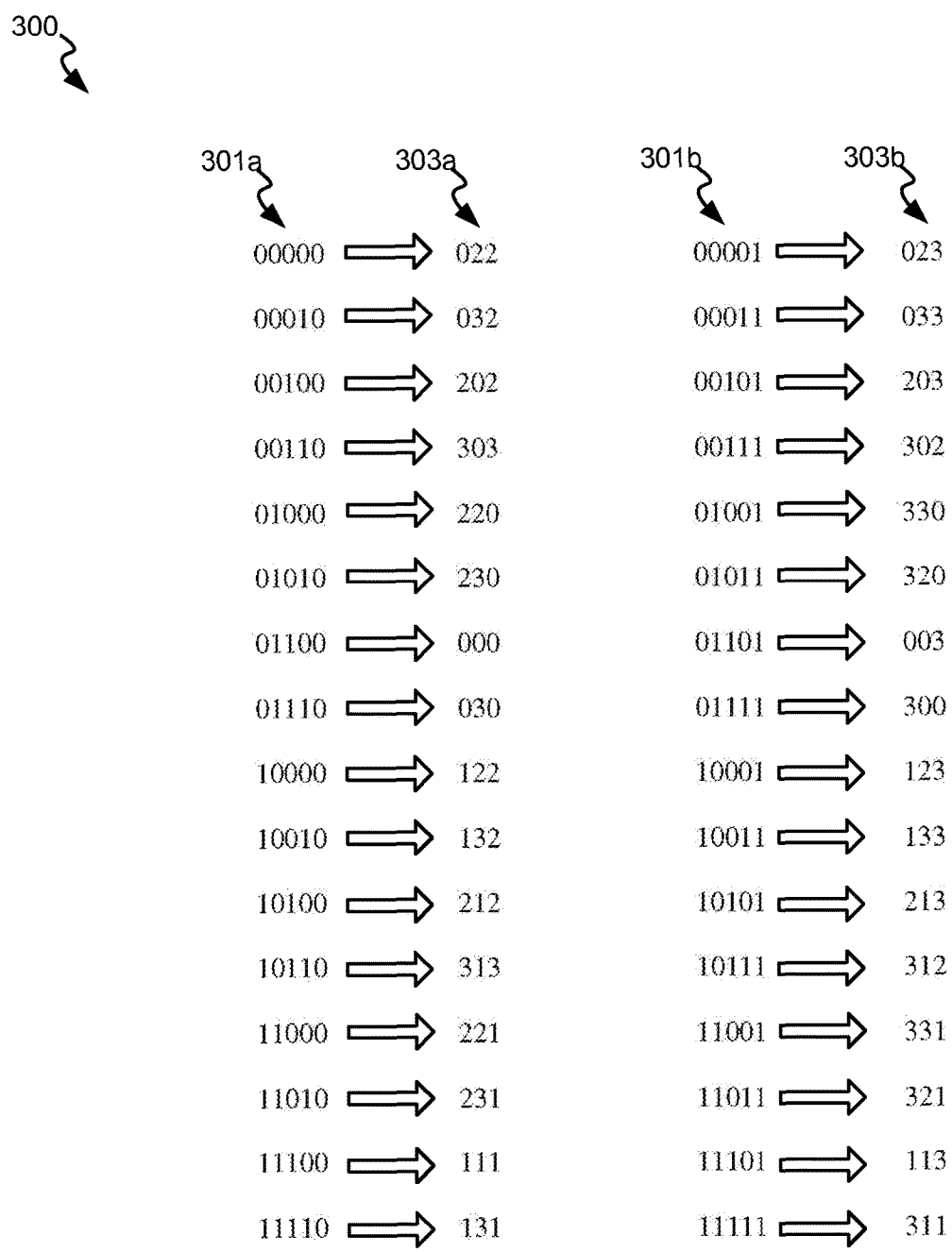
FIG. 3 shows a five bit word to three voltage levels conversion table in accordance with some embodiments of the present invention.
Figure 4A:
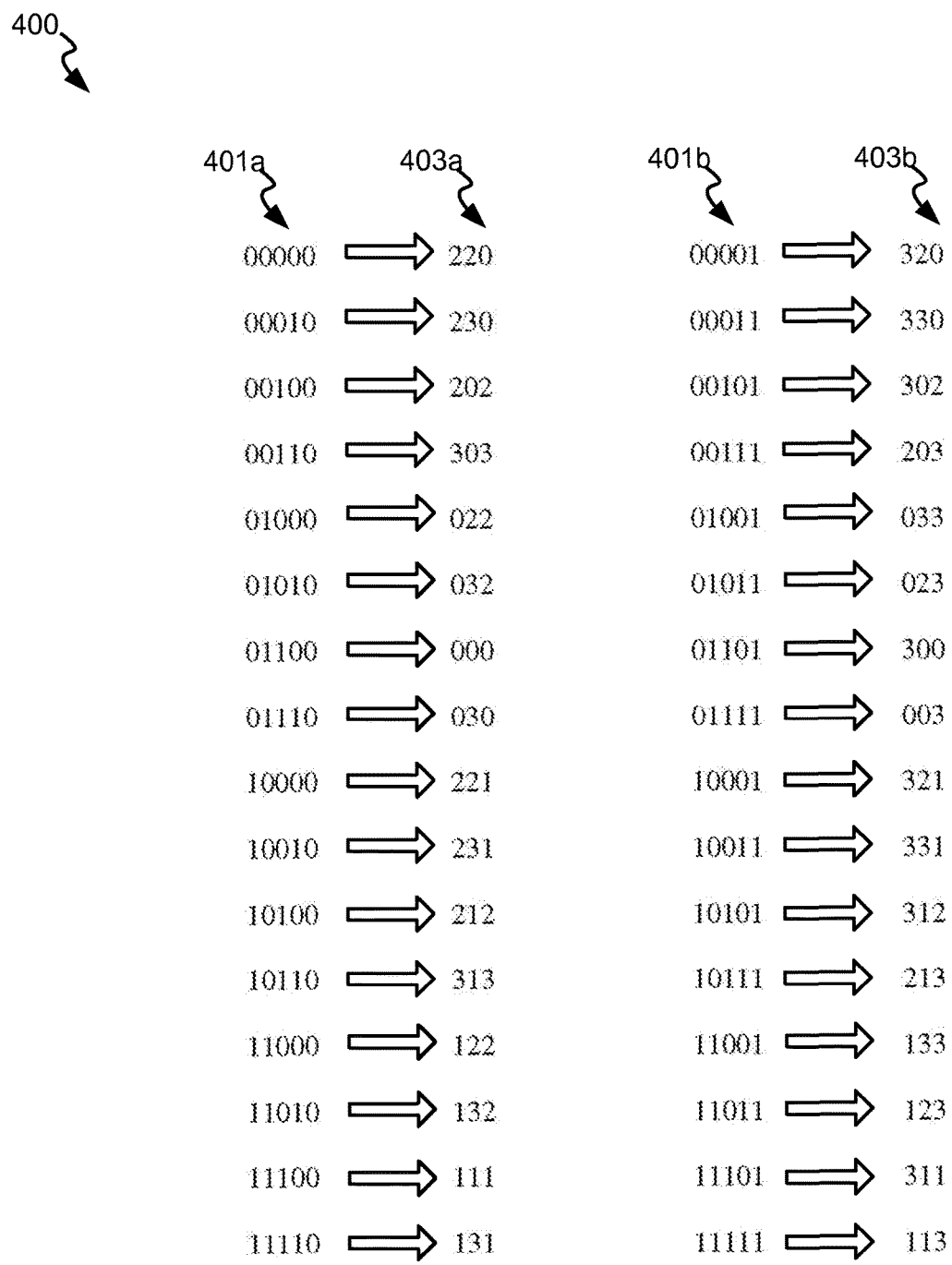
FIG. 4a shows another five bit word to three voltage levels conversion table in accordance with some embodiments of the present invention.

Returning to FIG. 1, voltage value encoding circuit 109 encodes each of the n five bit words discussed in relation to FIG. 2 to a corresponding three value output that is provided as write data 111. Turning to FIG. 3, a five bit word 301*a*, 301*b* ({A, B, C, D, E}) to three voltage levels 303*a*, 303*b* ({X, Y, Z}) conversion table 300 is shown in accordance with some embodiments of the present invention. As shown, five bit word 301*a*, 301*b* correspond to the five bit words ({A, B, C, D, E}) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4*a*, another five bit word 401*a*, 401*b* ({A, B, C, D, E}) to three voltage levels 403*a*, 403*b* ({X, Y, Z}) conversion table 400 in accordance with some embodiments of the present invention. As shown, five bit word 401*a*, 401*b* correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 1, write data 111 is provided to a write circuit 130. In addition, write circuit 130 receives an address 110 is received from host controller circuit 195. Write circuit 130 converts the voltage levels (e.g., {X, Y, Z}) received as write data 111 into a series of voltages 135 that are written to three cells of flash memory cells 140 indicated by address 110. Thus, for example, in the case where each cell of flash memory cells 140 are written as two bit cells, a voltage level of "0" (i.e., for a value of X, Y or Z equal to zero) results in voltage 135 being set below a lower threshold ($V_L$), a voltage level of "1" (i.e., for a value of X, Y or Z equal to one) results in voltage 135 being set above the lower threshold ($V_L$) and below a center threshold ($V_C$), a voltage level of "2" (i.e., for a value of X, Y or Z equal to two) results in voltage 135 being set above the center threshold ($V_C$) and below an upper threshold ($V_U$), and a voltage level of "3" (i.e., for a value of X, Y or Z equal to three) results in voltage 135 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 107.

A data read is effectuated when host controller circuit 195 provides a read request indication 112 and address 110 to read controller and soft data output voltage value decoding circuit 180. Read controller and soft data output voltage value decoding circuit 180 translates read request 112 and address 110 into an address 154 and a threshold value 156 (or series of threshold values) that are provided to a read circuit 150. A read location 144 is generated based upon address 154 and provided to flash memory cells 140. In response, flash memory cells 140 provides return voltages 142 stored at the cells indicated by read location 144. Read circuit 150 compares return voltages 142 with threshold 156 to yield corresponding binary values 152.

Figure 4B:
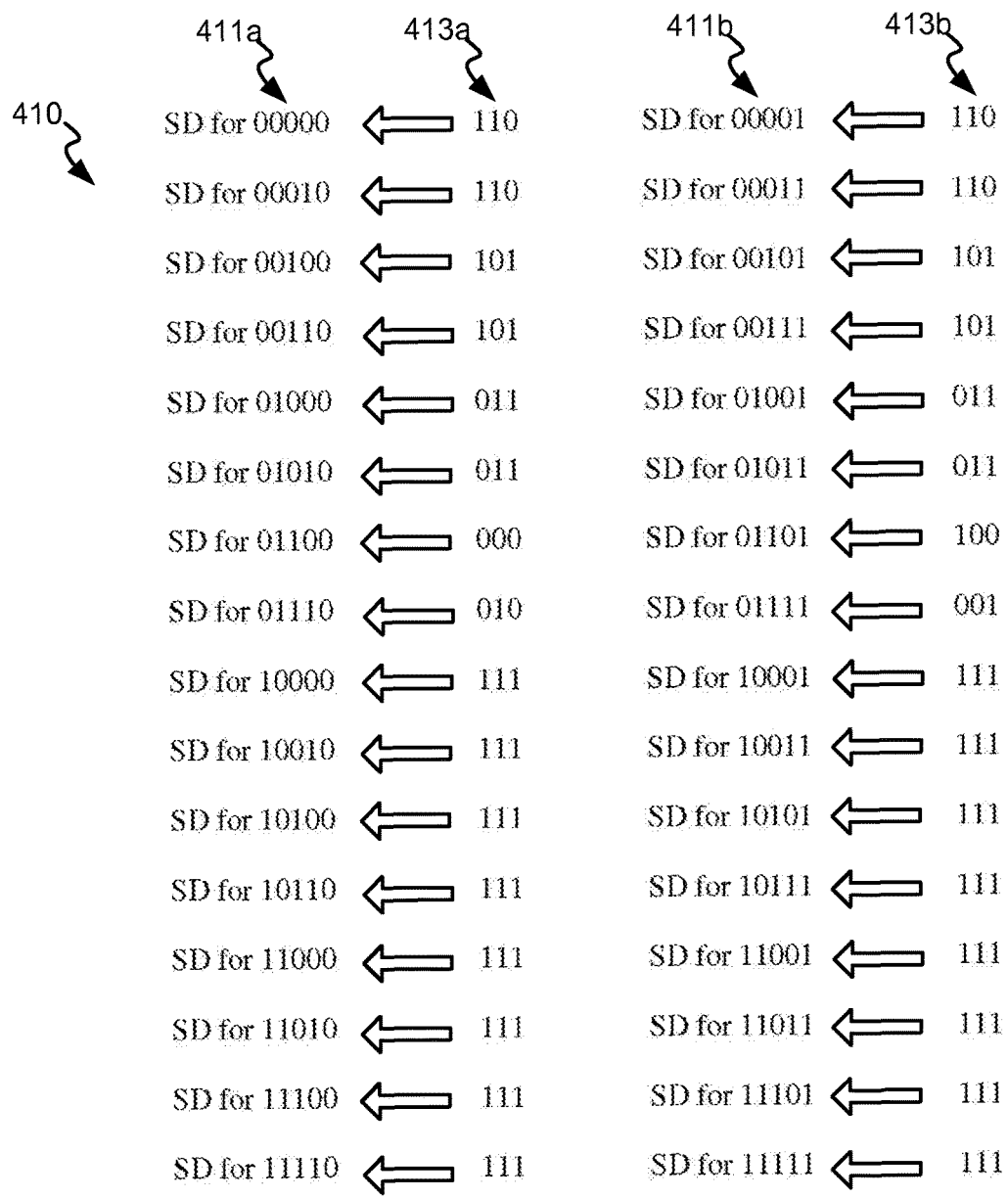
FIGS. 4b-4d show page by page voltage level to corresponding bit(s) of the five bit word conversion in accordance with various embodiments of the present invention.

Turning to FIG. 4*b*, a first part of the aforementioned process of comparing return voltages 142 with threshold 156 is shown where the conversion of FIG. 4*a* was used in the original encoding. This first part recovers a soft data representation of the first LDPC codeword (i.e., low density parity check codeword 201). As shown, a table 410 represents conversion of the three voltage levels 403*a*, 403*b* ({X, Y, Z}) of FIG. 4*a* where threshold 156 is the lower threshold ($V_L$). By comparing with $V_L$, any voltage value received as return voltages 142 that is less than $V_L$ (e.g., the voltage level of "0" discussed above) results in a binary '0', while any voltage value received as return voltages 142 that is greater than or equal to $V_L$ (e.g., the voltage levels of "1", "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 413*a*, 413*b*). As another example, where three cells of flash memory cells 140 return three voltage levels of "3, 1, 2", respectively, the corresponding binary output is '111' (shown as values 413*a*, 413*b*). These binary values map to a single soft data value corresponding to one LDPC codeword (i.e., low density parity check codeword 201). Said another way, the three bit binary values 413*a*, 413*b* map to soft data for a corresponding five bit word (i.e., SD for XXXX 411*a*, 411*b*). The conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201).

In some embodiments, the soft data values for any bit of a five bit word corresponding to the respective three bit binary values are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability }[b_p = 0 \mid Y]}{\text{Probability }[b_p = 1 \mid Y]}\right),$$

where LLR is a log-likelihood ratio, Y represents the three bit value 413*a*, 413*b* derived from flash memory cells 140, p represents the position in the five bit word, and $b_p$ represents the binary value for the bit at position p. The aforementioned equation is derived based upon the following:

$$\text{Probability }(b_p, Y) = \sum_{\{bi:i \neq p\}} \text{Probability }(C(b_0, b_1, \ldots, b_{Np-1}) \mid Y),$$

where C are the three voltages provided from flash memory cells; where:

$$\text{Probability }(C, Y) = \frac{\text{Probability }(Y \mid C)}{\sum_{C'} \text{Probability }(Y \mid C')}, \text{ where}$$

-continued $$\text{Probability}(Y, C) = \text{Probability}(Y \mid l(C)) = \prod_{i=0}^{L-1} \text{Probability}(y_i \mid l(c_i))$$

for the case of additive white Gaussian noise:

$$\text{Probability}(y = 0 \mid l) = \frac{1}{2}\left[1 + \text{erf}\left(\frac{t-l}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability }[b_p = 0 \mid U]}{\text{Probability }[b_p = 1 \mid U]}\right),$$

where U represents a quantized version of the three bit value 413a, 413b derived from flash memory cells 140.

Figure 4C:
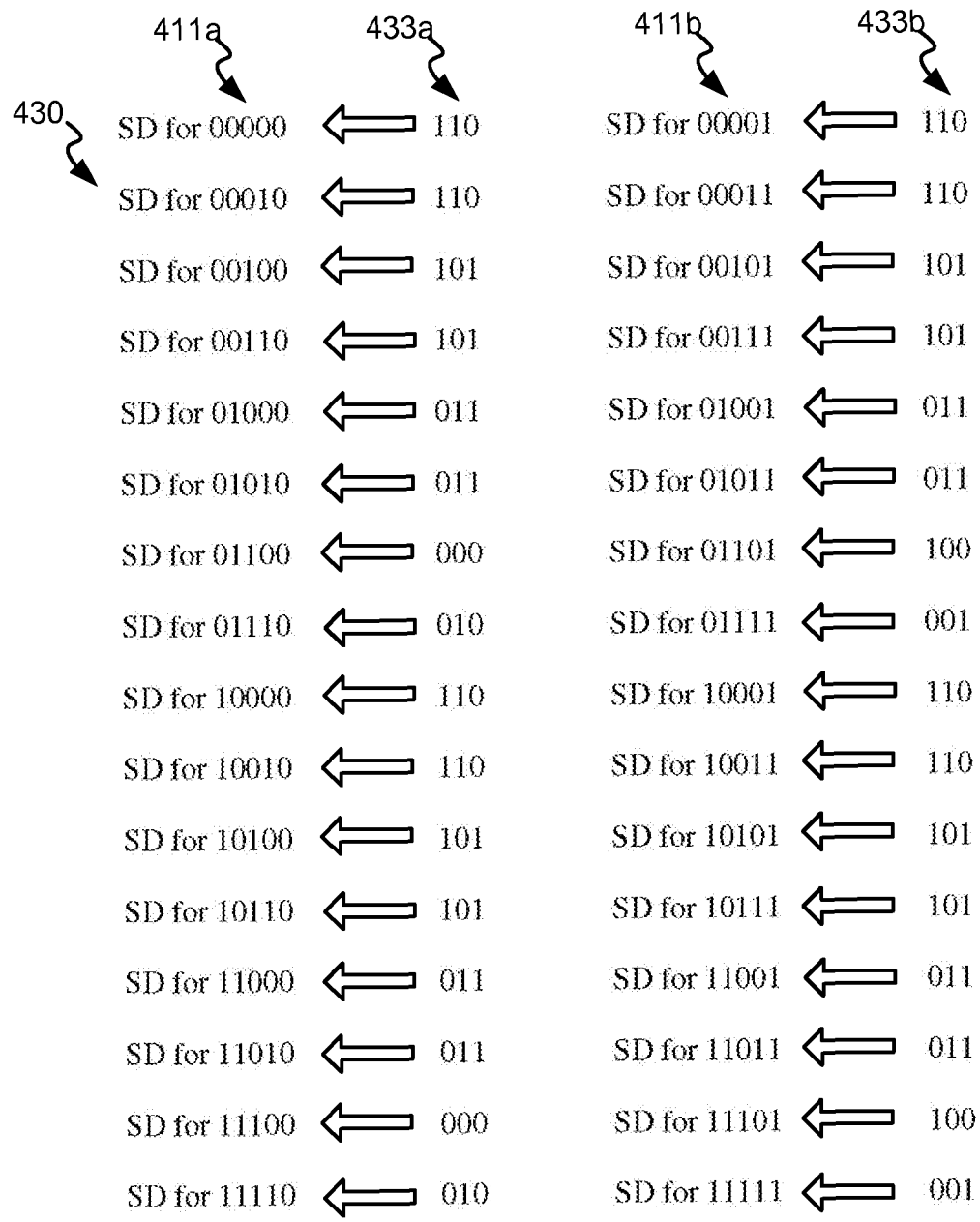

Turning to FIG. 4c, a second part of the aforementioned process of comparing return voltages 142 with threshold 156 is shown where the conversion of FIG. 4a was used in the original encoding. This second part recovers the second and third LDPC codewords (i.e., low density parity check codeword 203 and low density parity check codeword 205). As shown, a table 430 represents conversion of the three voltage levels 403a, 403b ({X, Y, Z}) of FIG. 4a where threshold 156 is the center threshold ($V_C$). By comparing with $V_C$, any voltage value received as return voltages 142 that is less than $V_C$ (e.g., the voltage levels of "0" or "1" discussed above) results in a binary '0', while any voltage value received as return voltages 142 that is greater than or equal to $V_C$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 433a, 433b). As another example, where three cells of flash memory cells 140 return three voltage levels of "3, 1, 2", respectively, the corresponding binary output is '101' (shown as values 433a, 433b). These binary values map to two soft data values corresponding to two LDPC codewords (i.e., low density parity check codeword 203 and low density parity check codeword 205). Said another way, the three bit binary values 433a, 433b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 203 and low density parity check codeword 205). This process is repeated until soft data values corresponding to all bits of the LDPC codewords are generated (i.e., low density parity check codeword 203 and low density parity check codeword 205). Of note, a '111' pattern is an invalid value, but a soft data value is generated for it and all other valid patterns.

Figure 4D:
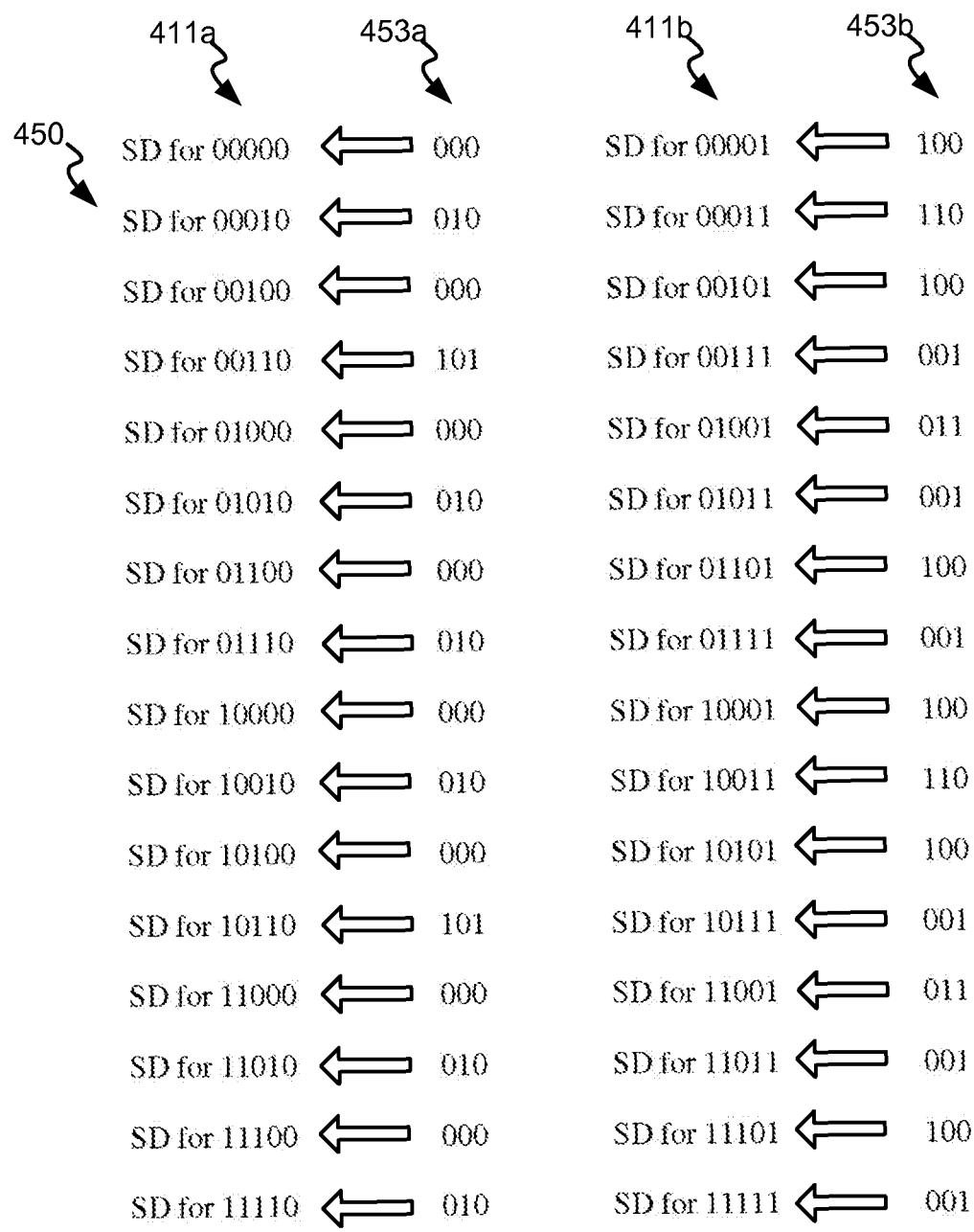

Turning to FIG. 4d, a third part of the aforementioned process of comparing return voltages 142 with threshold 156 is shown where the conversion of FIG. 4a was used in the original encoding. This third part recovers the fourth and fifth LDPC codewords (i.e., low density parity check codeword 207 and low density parity check codeword 209). As shown, a table 450 represents conversion of the three voltage levels 403a, 403b ({X, Y, Z}) of FIG. 4a where threshold 156 is the upper threshold ($V_U$). By comparing with $V_U$, any voltage value received as return voltages 142 that is less than $V_U$ (e.g., the voltage levels of "0" or "1" discussed above) results in a binary '0', while any voltage value received as return voltages 142 that is greater than or equal to $V_U$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '000' (shown as values 453a, 453b). As another example, where three cells of flash memory cells 140 return three voltage levels of "3, 1, 2", respectively, the corresponding binary output is '100' (shown as values 453a, 453b). These binary values map to two soft data values corresponding to two LDPC codewords (i.e., low density parity check codeword 203 and low density parity check codeword 205). Said another way, the three bit binary values 453a, 453b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_U$ is performed to yield the soft data values corresponding to the next bits of the two LDPC codewords (i.e., low density parity check codeword 207 and low density parity check codeword 209). This process is repeated until soft data values corresponding to all bits of the LDPC codewords are generated (i.e., low density parity check codeword 207 and low density parity check codeword 209). Of note, a '111' pattern is an invalid value, but a soft data value is generated for it and all other valid patterns.

Binary values 152 are provided to read controller and soft data output voltage value decoding circuit 180 where they are decoded to yield soft data 182 corresponding to the underlying LDPC codewords (i.e., soft data representation of the originally encoded LDPC codewords 107). Soft data 182 corresponding to the underlying LDPC codewords is provided low density parity check decoding circuit 190. Low density parity check decoding circuit 190 applies a low density parity check decoding algorithm to soft data 182 to yield recovered read data 192 that is provided to host controller circuit 195.

Figure 5:
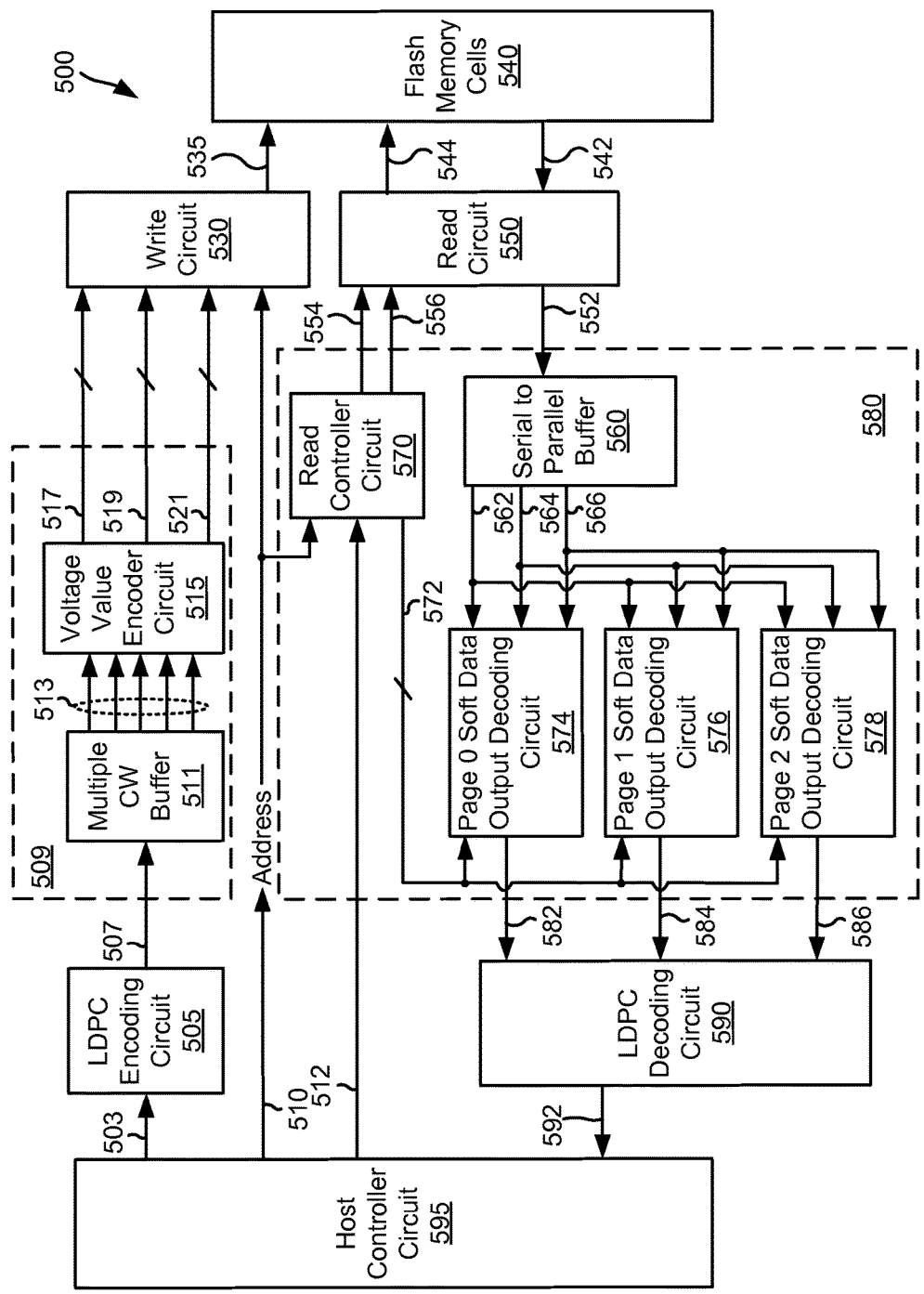
FIG. 5 shows a more detailed example of a solid state storage system including soft data output voltage value decoding circuitry in accordance with some embodiments of the present invention.

Turning to FIG. 5, a solid state storage system 500 is shown that includes soft data output voltage value decoding circuitry in accordance with some embodiments of the present invention. Solid state storage system 500 includes a host controller circuit 595, a low density parity check encoding circuit 505, a voltage value encoding circuit 509 shown in dashed lines, a write circuit 530, flash memory cells 540, a read circuit 550, a read controller and soft data output voltage value decoding circuit 580 shown in dashed lines, and a low density parity check decoding circuit 590.

Read controller and soft data output voltage value decoding circuit 580 includes a read controller circuit 570, a serial to parallel buffer circuit 560, and three page soft data output decoding circuits 574, 576, 578. Voltage value encoding circuit 509 includes a multiple codeword buffer circuit 511 and a multi-level cell encoder circuit 515. Host controller circuit 595 directs read and write access to flash memory cells 540. Flash memory cells 540 may be NAND flash memory cells or another type of solid state memory cells as are known in the art.

A data write is effectuated when host controller circuit 595 provides input data 503 to low density parity check encoding circuit 505. Low density parity check encoding circuit 505 applies a low density parity check encoding algorithm to input data 503 to yield LDPC codewords 507. Low density parity check encoding circuit 505 may be any circuit known in the art that is capable of receiving user data and generating corresponding low density parity check codewords. LDPC codewords 507 are provided to multi-level cell encoding circuit 509. Multiple codeword buffer circuit 511 of voltage value encoding circuit 509 stores five LDPC codewords received as LDPC codewords 507. Individual bits of each of the five stored codewords are selected and provided as a five bit word 513. This process is repeated for each bit position of the respective LDPC codewords resulting in a series of five bit words 513 being provided sequentially to multi-level cell encoder circuit 515 where the five bit words are encoded as three voltage values 517, 519, 521. Voltage value 517 corresponds to a voltage level that is to be written to a first of a three cell block of flash memory cells 540, voltage value 519 corresponds to a voltage level that is to be written to a second of the three cell block of flash memory cells 140, and voltage value 521 corresponds to a voltage level that is to be written to a third of the three cell block of flash memory cells 540. In some embodiments, voltage values 517, 519, 521 may be one of four voltage levels each representing a two-bit pattern stored in a given cell of flash memory cells 540. It should be noted that in other embodiments, eight or more voltage levels representing three or more bits stored in a given cell of flash memory cells 540 are possible in accordance with other embodiments of the present invention.

Turning to FIG. 2, multi-level cell encoding 200 is shown using multiple low density parity check codewords 201, 203, 205, 207, 209 to yield a series of five bit words 513 that are encoded into write data in accordance with some embodiments of the present invention. Each of the low density parity check codewords 201, 203, 205, 207, 209 includes a number of bits indicated as positions (i.e., position 1, position 2, . . . position n−1, and position n). Thus, at position 1 a five bit word 513 includes the first element of each of the five low density parity check codewords 201, 203, 205, 207, 209 (i.e., $\{A_1, B_1, C_1, D_1, E_1\}$). This is repeated for each of the positions 1 through n to yield n five bit words 513 (i.e., $\{A_2, B_2, C_2, D_2, E_2\} \ldots \{A_n, B_n, C_n, D_n, E_n\}$).

Returning to FIG. 5, multi-level cell encoder circuit 515 encodes each of the n five bit words 513 to a corresponding three value output that is provided as voltage values 517, 519, 521 to write circuit 530. Turning to FIG. 3, a five bit word 301*a*, 301*b* ($\{A, B, C, D, E\}$) to three voltage levels 303*a*, 303*b* ($\{X, Y, Z\}$) conversion table 300 is shown in accordance with some embodiments of the present invention. As shown, five bit word 301*a*, 301*b* correspond to the five bit words ($\{A, B, C, D, E\}$) discussed above in relation to FIG. 2. Thus, for example, where the five bit word is '00000' the corresponding three voltage levels ($\{X, Y, Z\}$) are "0, 2, 2". Similarly, where three voltage levels are "3, 1, 2" the corresponding five bit word is '10111'. Turning to FIG. 4*a*, another five bit word 401*a*, 401*b* ($\{A, B, C, D, E\}$) to three voltage levels 403*a*, 403*b* ($\{X, Y, Z\}$) conversion table 400 in accordance with some embodiments of the present invention. As shown, five bit word 401*a*, 401*b* correspond to the five bit words ($\{A, B, C, D, E\}$) discussed above in relation to FIG. 2. Thus, for example, where the five bit word is '00000' the corresponding three voltage levels ($\{X, Y, Z\}$) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 5, write circuit 530 additionally receives an address 510 from host controller circuit 595. Write circuit 530 converts voltage values 517, 519, 521 (e.g., $\{X, Y, Z\}$) into a series of voltages 535 that are written to three cells of flash memory cells 540 indicated by address 510. Thus, for example, in the case where each cell of flash memory cells 540 are written as two bit cells, a voltage level of "0" (i.e., for a value of X, Y or Z equal to zero) results in voltage 535 being set below a lower threshold ($V_L$), a voltage level of "1" (i.e., for a value of X, Y or Z equal to one) results in voltage 535 being set above the lower threshold ($V_L$) and below a center threshold ($V_C$), a voltage level of "2" (i.e., for a value of X, Y or Z equal to two) results in voltage 535 being set above the center threshold ($V_C$) and below an upper threshold ($V_U$), and a voltage level of "3" (i.e., for a value of X, Y or Z equal to three) results in voltage 535 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 507.

A data read is effectuated when host controller circuit 595 provides a read request indication 512 and address 510 to read controller circuit 570 of read controller and soft data output voltage value decoding circuit 580. Read controller circuit 570 translates read request 512 and address 510 into an address 554 and a threshold value 556 (or series of threshold values) that are provided to read circuit 550. A read location 544 is generated by read circuit 550 based upon address 554 and provided to flash memory cells 540. In response, flash memory cells 540 provides return voltages 542 stored at the cells indicated by read location 544. Read circuit 550 compares return voltages 542 with threshold 556 to yield corresponding binary values 552.

Binary values 552 are provided to serial to parallel buffer 560 that assembles the binary values into sets of three bits 562, 564, 566 associated with the same five bit words. Bits 562, 564, 566 are provided to each of page 0 soft data output decoding circuit 574, page 1 soft data output decoding circuit 576, and page 2 soft data output decoding circuit 578. Based upon the ongoing read, read controller circuit 570 asserts various enables 572 that enable operation of respective ones of page 0 soft data output decoding circuit 574, page 1 soft data output decoding circuit 576, and page 2 soft data output decoding circuit 578. In particular, when soft data corresponding to all of the codewords associated with the five bit words is to be generated, read controller circuit 570 sequentially provides: the lower threshold ($V_L$) to obtain the soft data corresponding to the first LDPC codeword represented in the five bit words, the center threshold ($V_C$) to obtain the soft data corresponding to the second and third LDPC codewords represented in the five bit words, and the upper threshold ($V_U$) to obtain the soft data corresponding to the fourth and fifth LDPC codewords represented in the five bit words as threshold value 556. Where soft data corresponding to only specific ones of the LDPC codewords represented in the five bit words is to be generated, some subset of the lower threshold ($V_L$), the center threshold ($V_C$), and/or the upper threshold ($V_U$) are sequentially presented as threshold value 556. For example, where soft data for only the third and fourth LDPC codewords is to be generated, the center threshold ($V_C$), and/or the upper threshold ($V_U$) are sequentially presented as threshold value 556. As another example, where soft data for only the fifth LDPC codeword is to be generated, only the upper threshold ($V_U$) is presented.

When the upper threshold ($V_U$) is presented as threshold value 556, enables 572 are asserted by read controller circuit 570 such that operation of page 2 soft data output decoding circuit 578 is enabled, while operation of page 0 soft data output decoding circuit 574 and page 1 soft data output decoding circuit 576 is disabled. Alternatively, when the center threshold ($V_C$) is presented as threshold value 556, enables 572 are asserted by read controller circuit 570 such that operation of page 1 soft data output decoding circuit 576 is enabled, while operation of page 0 soft data output decoding circuit 574 and page 2 soft data output decoding circuit 578 is disabled. As the other alternative, when the lower threshold ($V_L$) is presented as threshold value 556, enables 572 are asserted by read controller circuit 570 such that operation of page 0 soft data output decoding circuit 574 is enabled, while operation of page 1 soft data output decoding circuit 576 and page 2 soft data output decoding circuit 578 is disabled.

When enabled, page 0 soft data output decoding circuit 574 generates soft data corresponding to the first LDPC codeword represented in the five bit words based upon bits 562, 564, 566 corresponding to the result of comparing return voltages 542 with the lower threshold ($V_L$). The generated soft data corresponding to the first LDPC codeword is provided as a soft data output 582 to LDPC decoding circuit 590. Similarly, when enabled, page 1 soft data output decoding circuit 576 generates soft data corresponding to the second and third LDPC codewords represented in the five bit words based upon bits 562, 564, 566 corresponding to the result of comparing return voltages 542 with the center threshold ($V_C$). The generated soft data corresponding to the second and third LDPC codewords is provided as a soft data output 584 to LDPC decoding circuit 590. Similarly, when enabled, page 2 soft data output decoding circuit 578 generates soft data corresponding to the fourth and fifth LDPC codewords represented in the five bit words based upon bits 562, 564, 566 corresponding to the result of comparing return voltages 542 with the upper threshold ($V_U$). The generated soft data corresponding to the fourth and fifth LDPC codewords is provided as a soft data output 586 to LDPC decoding circuit 590.

Turning to FIG. 4b, a first part of the aforementioned process of comparing return voltages 542 with threshold 556 is shown where the conversion of FIG. 4a was used in the original encoding. This first part recovers a soft data representation of the first LDPC codeword (i.e., low density parity check codeword 201). As shown, a table 410 represents conversion of the three voltage levels 403a, 403b ({X, Y, Z}) of FIG. 4a where threshold 556 is the lower threshold ($V_L$). By comparing with $V_L$, any voltage value received as return voltages 542 that is less than $V_L$ (e.g., the voltage level of "0" discussed above) results in a binary '0', while any voltage value received as return voltages 542 that is greater than or equal to $V_L$ (e.g., the voltage levels of "1", "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 413a, 413b). As another example, where three cells of flash memory cells 540 return three voltage levels of "3, 1, 2", respectively, the corresponding binary output is '111' (shown as values 413a, 413b). These binary values map to a single soft data value corresponding to one LDPC codeword (i.e., low density parity check codeword 201). Said another way, the three bit binary values 413a, 413b map to soft data for a corresponding five bit word (i.e., SD for XXXX 411a, 411b). The conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201).

In some embodiments, the soft data values for any bit of a five bit word corresponding to the respective three bit binary values are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability } [b_p = 0 \mid Y]}{\text{Probability } [b_p = 1 \mid Y]}\right),$$

where LLR is a log-likelihood ratio, Y represents the three bit value 413a, 413b derived from flash memory cells 540, p represents the position in the five bit word, and $b_p$ represents the binary value for the bit at position p. The aforementioned equation is derived based upon the following:

$$\text{Probability}(b_p, Y) = \sum_{\{b_i : i \neq p\}} \text{Probability}(C(b_0, b_1, \ldots, b_{N_p-1}) \mid Y),$$

where C are the three voltages provided from flash memory cells; where:

$$\text{Probability}(C, Y) = \frac{\text{Probability}(Y \mid C)}{\sum_{C'} \text{Probability}(Y \mid C')}, \text{ where}$$

$$\text{Probability}(Y, C) = \text{Probability}(Y \mid l(C)) = \prod_{i=0}^{L-1} \text{Probability}(y_i \mid l(c_i))$$

for the case of additive white Gaussian noise:

$$\text{Probability } (y = 0 \mid l) = \frac{1}{2}\left[1 + \text{erf}\left(\frac{t-l}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability } [b_p = 0 \mid U]}{\text{Probability } [b_p = 1 \mid U]}\right),$$

where U represents a quantized version of the three bit value 413a, 413b derived from flash memory cells 540.

Turning to FIG. 4c, a second part of the aforementioned process of comparing return voltages 542 with threshold 556 is shown where the conversion of FIG. 4a was used in the original encoding. This second part recovers the second and third LDPC codewords (i.e., low density parity check codeword 203 and low density parity check codeword 205). As shown, a table 430 represents conversion of the three voltage levels 403a, 403b ({X, Y, Z}) of FIG. 4a where threshold 556 is the center threshold ($V_C$). By comparing with $V_C$, any voltage value received as return voltages 542 that is less than $V_C$ (e.g., the voltage levels of "0" or "1" discussed above) results in a binary '0', while any voltage value received as return voltages 542 that is greater than or equal to $V_C$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 433a, 433b). As another example, where three cells of flash memory cells 540 return three voltage levels of "3, 1, 2", respectively, the corresponding binary output is '101' (shown as values 433a, 433b). These binary values map to two soft data values corresponding to two LDPC codewords (i.e., low density parity check codeword 203 and low density parity check codeword 205). Said another way, the three bit binary values 433a, 433b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 203 and low density parity check codeword 205). This process is repeated until soft data values corresponding to all bits of the LDPC codewords are generated (i.e., low density parity check codeword 203 and low density parity check codeword 205). Of note, a '111' pattern is an invalid value, but a soft data value is generated for it and all other valid patterns.

Turning to FIG. 4d, a second part of the aforementioned process of comparing return voltages 542 with threshold 556 is shown where the conversion of FIG. 4a was used in the original encoding. This second part recovers the fourth and fifth LDPC codewords (i.e., low density parity check codeword 207 and low density parity check codeword 209). As shown, a table 450 represents conversion of the three voltage levels 403a, 403b ({X, Y, Z}) of FIG. 4a where threshold 556 is the upper threshold ($V_U$). By comparing with $V_U$, any voltage value received as return voltages 542 that is less than $V_U$ (e.g., the voltage levels of "0" or "1" discussed above) results in a binary '0', while any voltage value received as return voltages 542 that is greater than or equal to $V_U$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '000' (shown as values 453a, 453b). As another example, where three cells of flash memory cells 540 return three voltage levels of "3, 1, 2", respectively, the corresponding binary output is '100' (shown as values 453a, 453b). These binary values map to two soft data values corresponding to two LDPC codewords (i.e., low density parity check codeword 203 and low density parity check codeword 205). Said another way, the three bit binary values 453a, 453b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 207 and low density parity check codeword 209). This process is repeated until soft data values corresponding to all bits of the LDPC codewords are generated (i.e., low density parity check codeword 207 and low density parity check codeword 209). Of note, a '111' pattern is an invalid value, but a soft data value is generated for it and all other valid patterns.

Low density parity check decoding circuit 590 applies a low density parity check decoding algorithm to the resulting soft data values corresponding to LDPC codewords provided as soft data output 582, soft data output 584 and/or soft data output 586 to yield recovered read data 592 that is provided to host controller circuit 595. Where page 0 soft data output decoding circuit 574, page 1 soft data output decoding circuit 576, and page 2 soft data output decoding circuit 578 are implemented as look-up tables, three look-up tables are used—one for each of page 0, page 1 and page 2. Each of the aforementioned look-up tables includes $2^N$ entries where N is three in the case of three bit binary values. Where quantized inputs are used, each of the aforementioned look-up tables includes $NU^N$ entries where NU is the number of bins which for the aforementioned embodiments is two.

Figure 6:
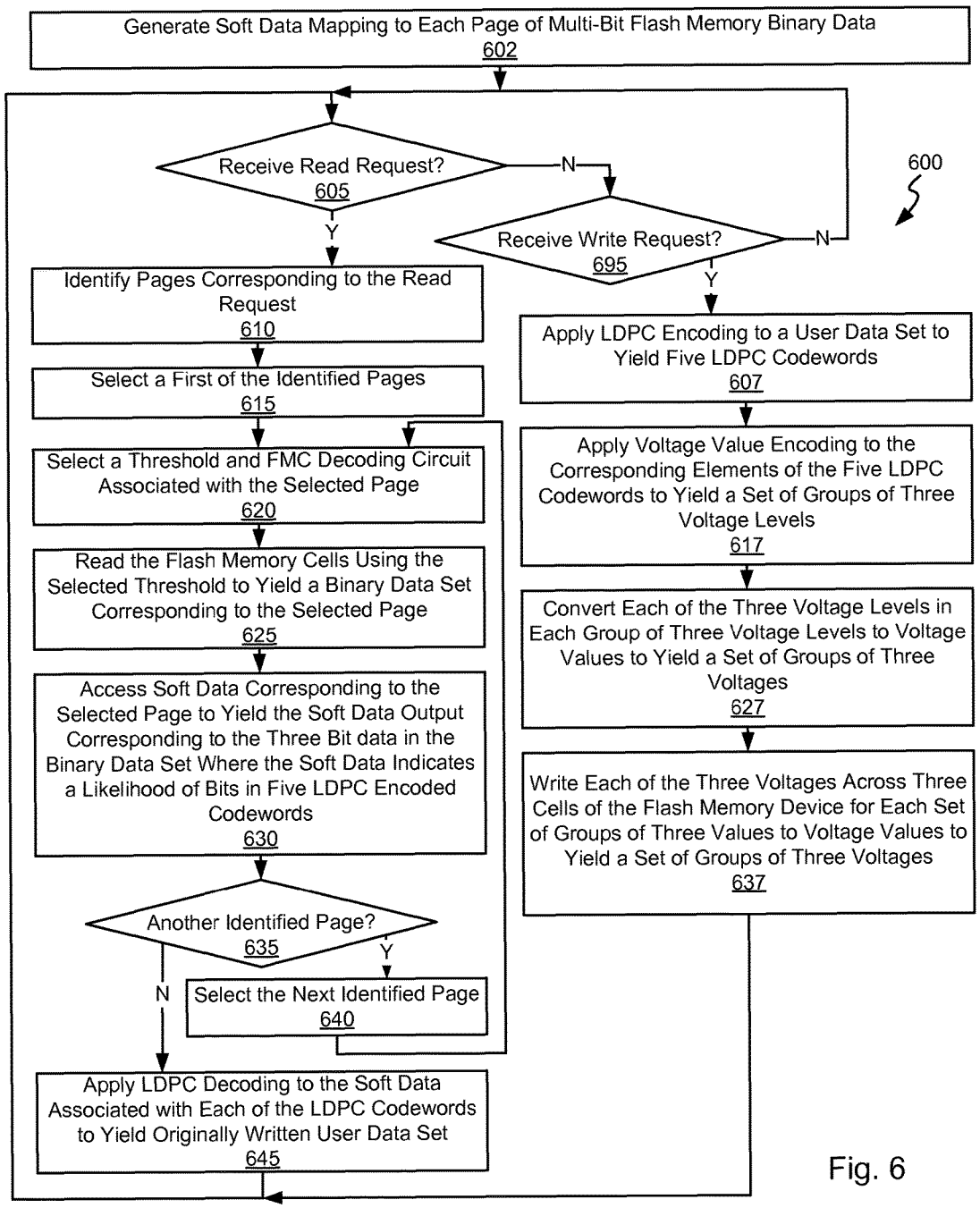
FIG. 6 shows a method in accordance with various embodiments of the present invention for soft data based flash memory access.

Turning to FIG. 6, a flow diagram 600 shows a method in accordance with various embodiments of the present invention for efficient storage and access to/from flash memory cells. Following flow diagram 600, it is determined whether a read request is received (block 605). Where a read request has not been received (block 605), it is determined whether a write request is received (block 695). Where a write request has been received (block 695), low density parity encoding is applied to a user data set received as part of the write request (block 607). Five of the LDPC codewords resulting from application of the low density parity encoding are combined, and voltage value encoding is applied to the corresponding elements of the five LDPC codewords to yield a set of groups of three voltage levels (block 617).

The aforementioned process includes grouping corresponding elements of the five LDPC codewords to yield groups of five bit words. Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, . . . position n−1, and position n). Thus, at position 1 a five bit word includes the first element of each of the five low density parity check codewords 201, 203, 205, 207, 209 (i.e., $\{A_1, B_1, C_1, D_1, E_1\}$). This is repeated for each of the positions 1 through n to yield n five bit words (i.e., $\{A_2, B_2, C_2, D_2, E_2\}$ . . . $\{A_n, B_n, C_n, D_n, E_n\}$).

Once the grouping process is done for each of the n five bit words, the five bit words are encoded to yield the corresponding three voltage levels. Turning to FIG. 3, a five bit word 301a, 301b ($\{A, B, C, D, E\}$) to/from three voltage levels 303a, 303b ($\{X, Y, Z\}$) conversion table 300 is shown in accordance with some embodiments of the present invention. As shown, five bit word 301a, 301b correspond to the five bit words ($\{A, B, C, D, E\}$) discussed above in relation to FIG. 2. Thus, for example, where the five bit word is '00000' the corresponding three voltage levels ($\{X, Y, Z\}$) are "0, 2, 2". Similarly, where three voltage levels are "3, 1, 2" the corresponding five bit word is '10111'. Turning to FIG. 4a, another five bit word 401a, 401b ($\{A, B, C, D, E\}$) to/from three voltage levels 403a, 403b ($\{X, Y, Z\}$) conversion table 400 in accordance with some embodiments of the present invention. As shown, five bit word 401a, 401b correspond to the five bit words ($\{A, B, C, D, E\}$) discussed above in relation to FIG. 2. Thus, for example, where the five bit word is '00000' the corresponding three voltage levels ($\{X, Y, Z\}$) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 6, each of the three voltage levels for each of the groups of three voltage levels are converted to corresponding voltage values (block 627). As an example, in the case where each cell is written as a two bit cell, a voltage level of "0" (i.e., for a value of X, Y or Z equal to zero) results in a voltage value being set below a lower threshold ($V_L$), a voltage level of "1" (i.e., for a value of X, Y or Z equal to one) results in a voltage value being set above the lower threshold ($V_L$) and below a center threshold ($V_C$), a voltage level of "2" (i.e., for a value of X, Y or Z equal to two) results in a voltage value being set above the center threshold ($V_C$) and below an upper threshold ($V_U$), and a voltage level of "3" (i.e., for a value of X, Y or Z equal to three) results in voltage value being set above the upper threshold ($V_U$). These voltage values are then written to three cells of a flash memory device (block 637). This process results in storing three voltage values respectively to three cells within flash memory cells to represent a five bit word. This process is repeated for each of the five bit words resulting in a group of multiple sets of three flash memory cells representing the five LDPC codewords encoded from the originally received user data.

Alternatively, where a read request is received (block 605), pages corresponding to the request are identified (block 610). For example, if only the first of the LDPC codewords encoded to yield the set of groups of three voltage levels in block 617 is to be read, then only page 0 is identified. Alternatively, if only or both of the second and third of the LDPC codewords encoded to yield the set of groups of three voltage levels in block 617 is to be read, then only page 1 is identified. As yet another alternative, if only or both of the fourth and fifth of the LDPC codewords encoded to yield the set of groups of three voltage levels in block 617 is to be read, then only page 2 is identified. As yet another alternative, if all of the LDPC codewords encoded to yield the set of groups of three voltage levels in block 617 are to be read, then all of pages 0, 1, 2 are identified. Other subsets of pages may also be identified depending upon which of the LDPC codewords encoded to yield the set of groups of three voltage levels in block 617 are to be read.

The first of the identified pages is selected (block 615). Thus, for example, if only one page is to be read, then that one page is selected. If more than one page is to be read, then one of the more than one pages is selected. A threshold corresponding to the selected page to be read is selected (block 620). Thus, for example, if page 0 is selected to be read then lower threshold ($V_L$) is selected. Alternatively, if page 1 is selected to be read then center threshold ($V_C$) is selected. Alternatively, if page 2 is selected to be read then upper threshold ($V_U$) is selected.

The flash memory cells corresponding to the read request (i.e., the set of groups of three cells storing the encoded series of five bit words) are read using the selected threshold to yield a binary data set corresponding to the selected page (block 625). Where the lower threshold ($V_L$) is used, the binary data set includes the first LDPC codeword (i.e., low density parity check codeword 201). Alternatively, where the center threshold ($V_C$) is used, the binary data set includes the second and third LDPC codewords (i.e., low density parity check codeword 203 and low density parity check codeword 205). Alternatively, where the upper threshold ($V_U$) is used, the binary data set includes the fourth and fifth LDPC codewords (i.e., low density parity check codeword 207 and low density parity check codeword 209). This read yields a series of groups of three binary values for each group of three flash memory cells that are read.

Soft data corresponding to the selected page is accessed to yield the soft data output corresponding to the three bit data in the binary data set where the soft data indicates a likelihood that bits in a particular position in the five bit word are correct (block 630). Turning to FIG. 4b, a first part of the aforementioned process of comparing return voltages with the selected threshold is shown where the conversion of FIG. 4a was used in the original encoding. This first part recovers a soft data representation of the first LDPC codeword (i.e., low density parity check codeword 201). As shown, a table 410 represents conversion of the three voltage levels 403a, 403b ($\{X, Y, Z\}$) of FIG. 4a where the selected threshold is the lower threshold ($V_L$). By comparing with $V_L$, any voltage value received as return voltages that is less than $V_L$ (e.g., the voltage level of "0" discussed above) results in a binary '0', while any voltage value received as return voltages that is greater than or equal to $V_L$ (e.g., the voltage levels of "1", "2" or "3" discussed above) results in a binary '1'. Thus, for example, where three cells of the flash memory cells return three voltage levels of "2, 2, 0", respectively, the corresponding binary output is '110' (shown as values 413a, 413b). As another example, where three cells of the flash memory cells return three voltage levels of "3, 1, 2", respectively, the corresponding binary output is '111' (shown as values 413a, 413b). These binary values map to a single soft data value corresponding to one LDPC codeword (i.e., low density parity check codeword 201). Said another way, the three bit binary values 413a, 413b map to soft data for a corresponding five bit word (i.e., SD for XXXX 411a, 411b). The conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201).

In some embodiments, the soft data values for any bit of a five bit word corresponding to the respective three bit binary values are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability } [b_p = 0 \mid Y]}{\text{Probability } [b_p = 1 \mid Y]}\right),$$

where LLR is a log-likelihood ratio, Y represents the three bit value 413a, 413b derived from flash memory cells 540, p represents the position in the five bit word, and $b_p$ represents the binary value for the bit at position p. The aforementioned equation is derived based upon the following:

$$\text{Probability } (b_p, Y) = \sum_{\{b_i : i \neq p\}} \text{Probability } \left(C(b_0, b_1, \ldots, b_{N_{p-1}}) \mid Y\right),$$

where C are the three voltages provided from flash memory cells; where:

$$\text{Probability } (C, Y) = \frac{\text{Probability } (Y \mid C)}{\sum_{C'} \text{Probability } (Y \mid C')}, \text{ where}$$

$$\text{Probability } (Y, C) = \text{Probability } (Y \mid l(C)) = \prod_{i=0}^{L-1} \text{Probability } (y_i \mid l(c_i))$$

for the case of additive white Gaussian noise:

$$\text{Probability } (y = 0 \mid l) = \frac{1}{2}\left[1 + \text{erf}\left(\frac{t - l}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability } [b_p = 0 \mid U]}{\text{Probability } [b_p = 1 \mid U]}\right),$$

where U represents a quantized version of the three bit value 413a, 413b derived from the flash memory cells.

Turning to FIG. 4c, a second part of the aforementioned process of comparing the return voltages with the selected threshold is shown where the conversion of FIG. 4a was used in the original encoding. This second part recovers the second and third LDPC codewords (i.e., low density parity check codeword 203 and low density parity check codeword 205). As shown, a table 430 represents conversion of the three voltage levels 403a, 403b ({X, Y, Z}) of FIG. 4a where the selected threshold is the center threshold ($V_C$). By comparing with $V_C$, any voltage value received as the return voltages that is less than $V_C$ (e.g., the voltage levels of "0" or "1" discussed above) results in a binary '0', while any voltage value received as the return voltages that is greater than or equal to $V_C$ (e.g., the voltage levels of "2" or "3" discussed above) results in a binary '1'. Thus, for example, where three cells of the flash memory cells return three voltage levels of "2, 2, 0", respectively, the corresponding binary output is '110' (shown as values 433a, 433b). As another example, where three cells of the flash memory cells return three voltage levels of "3, 1, 2", respectively, the corresponding binary output is '101' (shown as values 433a, 433b). These binary values map to two soft data values corresponding to two LDPC codewords (i.e., low density parity check codeword 203 and low density parity check codeword 205). Said another way, the three bit binary values 433a, 433b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_C$ is performed to yield the soft data values corresponding to the next bits of the two LDPC codewords (i.e., low density parity check codeword 203 and low density parity check codeword 205). This process is repeated until soft data values corresponding to all bits of the LDPC codewords are generated (i.e., low density parity check codeword 203 and low density parity check codeword 205). Of note, a '111' pattern is an invalid value, but a soft data value is generated for it and all other valid patterns.

Turning to FIG. 4d, a third part of the aforementioned process of comparing the return voltages with the selected threshold is shown where the conversion of FIG. 4a was used in the original encoding. This third part recovers the second and third LDPC codewords (i.e., low density parity check codeword 207 and low density parity check codeword 209). As shown, a table 450 represents conversion of the three voltage levels 403a, 403b ({X, Y, Z}) of FIG. 4a where the selected threshold is the upper threshold ($V_U$). By comparing with $V_U$, any voltage value received as the return voltages that is less than $V_U$ (e.g., the voltage levels of "0" or "1" discussed above) results in a binary '0', while any voltage value received as the return voltages that is greater than or equal to $V_U$ (e.g., the voltage levels of "2" or "3" discussed above) results in a binary '1'. Thus, for example, where three cells of the flash memory cells return three voltage levels of "2, 2, 0", respectively, the corresponding binary output is '000' (shown as values 453a, 453b). As another example, where three cells of the flash memory cells return three voltage levels of "3, 1, 2", respectively, the corresponding binary output is '100' (shown as values 453a, 453b). These binary values map to two soft data values corresponding to two LDPC codewords (i.e., low density parity check codeword 203 and low density parity check codeword 205). Said another way, the three bit binary values 453a, 453b map to soft data for a corresponding five bit word (i.e., SD for XXXX 411a, 411b). Again, the conversion process may be done using a look up table that is loaded with pre-calculated soft data values corresponding to the respective three bit binary values. Alternatively, the soft data values corresponding to the respective three bit binary values may be calculated on the fly based upon the respective three bit binary values. The conversion may be done in accordance with the equations discussed above in relation to FIG. 4b. Comparison of the next set of three cells of flash memory cells with $V_U$ is performed to yield the soft data values corresponding to the next bits of the two LDPC codewords (i.e., low density parity check codeword 207 and low density parity check codeword 209). This process is repeated until soft data values corresponding to all bits of the LDPC codewords are generated (i.e., low density parity check codeword 207 and low density parity check codeword 209). Of note, a '111' pattern is an invalid value, but a soft data value is generated for it and all other valid patterns.

Returning to FIG. 6, it is determined if another page remains to be processed as part of the read request (block 635). Where another page remains to be processed (block 635), the next identified page is selected (block 640) and the processes of blocks 620-630 are repeated for the next identified page. Otherwise, where no other identified pages remain to be processed (block 635), LDPC decoding is applied to the soft data values generated for each of the LDPC codewords to yield the originally written user data set (block 645).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent—albeit such a system entirely implemented in software or firmware would not be a circuit. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for accessing a flash memory device, the system comprising:
   a data read circuit operable to provide a read location to flash memory cells, receive return voltages stored at the flash memory cells indicated by the read location, and then compare voltages read from a set of M groups of N flash memory cells with a first threshold value to yield a binary output set, wherein the binary output set includes a set of M groups of N binary values, and wherein M and N are integers;
   a first data decoding circuit operable to generate at least a first set of M soft data values each corresponding to a respective one of the M groups of N binary values; and
   a second data decoding circuit operable to decode the first set of M soft data values to yield a data output.

2. The system of claim 1, wherein the first set of M soft data values corresponds to a low density parity check codeword, and wherein the second data decoding circuit is a low density parity check decoding circuit.

3. The system of claim 1, wherein the binary output set is a first binary output set; wherein the data read circuit is further operable to compare voltages read from the set of M groups of N flash memory cells with a second threshold value to yield a second binary output set; and wherein the first data decoding circuit is further operable to:
   generate at least a second set of M soft data values each corresponding to a respective one of the M groups of N binary values, and a third set of M soft data values each corresponding to a respective one of the M groups of N binary values.

4. The system of claim 3, wherein the data output is a first data output, and wherein the second data decoding circuit is further operable to:
   decode the second set of M soft data values to yield a second data output, and
   decode the third set of M soft data values to yield a third data output.

5. The system of claim 1, wherein the binary output set is a first binary output set; wherein the data read circuit is further operable to compare voltages read from the set of M groups of N flash memory cells with a second threshold value to yield a second binary output set, and to compare voltages read from the set of M groups of N flash memory cells with a third threshold value to yield a third binary output set; and wherein the first data decoding circuit is further operable to:
   generate at least a second set of M soft data values each corresponding to a respective one of the M groups of N binary values based upon the second binary output set, and a third set of M soft data values each corresponding to a respective one of the M groups of N binary values based upon the second binary output set; and
   generate at least a fourth set of M soft data values each corresponding to a respective one of the M groups of N binary values based upon the third binary output set, and a fifth set of M soft data values each corresponding to a respective one of the M groups of N binary values based upon the second binary output set.

6. The system of claim 5, wherein the first set of M soft data values corresponds to a first low density parity check codeword, the second set of M soft data values corresponds to a second low density parity check codeword, the third set of M soft data values corresponds to a third low density parity check codeword, the fourth set of M soft data values corresponds to a fourth low density parity check codeword, and the fifth set of M soft data values corresponds to a fifth low density parity check codeword.

7. The system of claim 6, wherein N is three.

8. The system of claim 7, wherein M is 4096.

9. The system of claim 5, wherein the first data decoding circuit comprises:
   a first look-up table including soft data values corresponding to the first binary output set generated based upon the first threshold;
   a second look-up table including soft data values corresponding to the second binary output set generated based upon the second threshold; and
   a third look-up table including soft data values corresponding to the third binary output set generated based upon the third threshold.

10. The system of claim 1, wherein the system is implemented as part of an integrated circuit.

11. The system of claim 1, wherein the system further comprises:
    a first encoder circuit operable to apply a first encoding algorithm to a user data set to yield a number of the encoded codewords, wherein each of the number of encoded codewords includes M elements;
    a second encoder circuit operable to apply a second encoding algorithm to a combination of the first number of the encoded codewords to yield M sets of N voltage values; wherein each of the M sets of N voltage values represents corresponding elements of each of the number of the encoded codewords; and
    a write circuit operable to apply voltages indicated by each of the N voltage levels to respective ones of the flash memory cells.

12. A method for accessing a solid state memory device, the method comprising:
    accessing a set of M groups of N flash memory cells to yield M sets of N voltages, wherein M and N are integers, and wherein the set of M groups of N flash memory cells are accessed by providing a read location to the M groups of N flash memory cells then receiving return voltages stored at the M groups of N flash memory cells indicated by the read location;
    comparing the M sets of N voltages with a first threshold value to yield M sets of N binary outputs;
    using a first data decoding circuit to generate at least a first set of M soft data values each corresponding to a respective one of the M sets of N binary outputs; and
    using a second data decoding circuit to decode the first set of M soft data values to yield a data output.

13. The method of claim 12, wherein the M sets of N binary outputs is a first group of M sets of N binary outputs; wherein the data output is a first data output; and wherein the method further comprises:
    comparing the M sets of N voltages with a second threshold value to yield a second group of M sets of N binary outputs;
    using the first data decoding circuit to generate a second set of M soft data values and a third set of M soft data values where each of the M soft data values corresponds to a respective one of the M sets of N binary outputs in the second group of M sets of N binary outputs; and
    using the second data decoding circuit to:
       decode the second set of M soft data values to yield a second data output, and
       decode the third set of M soft data values to yield a third data output.

14. The method of claim 12, wherein the M sets of N binary outputs is a first group of M sets of N binary outputs; wherein the data output is a first data output; and wherein the method further comprises:
    comparing the M sets of N voltages with a second threshold value to yield a second group of M sets of N binary outputs;
    comparing the M sets of N voltages with a third threshold value to yield a third group of M sets of N binary outputs;
    using the first data decoding circuit to:
       generate a second set of M soft data values and a third set of M soft data values where each of the M soft data values corresponds to a respective one of the M sets of N binary outputs in the second group of M sets of N binary outputs; and
       generate a fourth set of M soft data values and a fifth set of M soft data values where each of the M soft data values corresponds to a respective one of the M sets of N binary outputs in the third group of M sets of N binary outputs; and
    using the second data decoding circuit to:
       decode the second set of M soft data values to yield a second data output;
       decode the third set of M soft data values to yield a third data output;
       decode the fourth set of M soft data values to yield a fourth data output; and
       decode the fifth set of M soft data values to yield a fifth data output.

15. The method of claim 14, wherein the first data decoding circuit comprises:
    a first look-up table including soft data values corresponding to the first group of M sets of N binary outputs generated based upon the first threshold;
    a second look-up table including soft data values corresponding to the second group of M sets of N binary outputs generated based upon the second threshold; and
    a third look-up table including soft data values corresponding to the third group of M sets of N binary outputs generated based upon the third threshold.

16. The method of claim 14, wherein the second data decoding circuit is a low density parity check decoding circuit.

17. The method of claim 16, wherein the first set of M soft data values corresponds to a first low density parity check codeword, the second set of M soft data values corresponds to a second low density parity check codeword, the third set of M soft data values corresponds to a third low density parity check codeword, the fourth set of M soft data values corresponds to a fourth low density parity check codeword, and the fifth set of M soft data values corresponds to a fifth low density parity check codeword.

18. The method of claim 12, wherein N is three.

19. The method of claim 12, wherein M is 4096.

20. A flash memory access system, the system comprising:
    a plurality of flash memory cells;
    a first encoder circuit operable to apply a low density parity check encoding algorithm to a user data set to yield a number of the low density parity check codewords, wherein each of the number of low density parity check codewords includes M elements, and wherein M is an integer;

a second encoder circuit operable to apply a second encoding algorithm to a combination of the first number of the low density parity check codewords to yield M sets of N voltage values, wherein each of the M sets of N voltage values represents corresponding elements of each of the number of the low density parity check codewords, and wherein N is an integer; and a write circuit operable to apply voltages indicated by each of the N voltage levels to respective ones of a subset of the flash memory cells;

a data read circuit operable to provide a read location to flash memory cells, receive return voltages stored at the flash memory cells indicated by the read location, and then compare voltages read from a set of M groups of N flash memory cells with a first threshold value to yield a binary output set, wherein the binary output set includes a set of M groups of N binary values, and wherein M and N are integers;

a first data decoding circuit operable to generate at least a first set of M soft data values each corresponding to a respective one of the M groups of N binary values;

a second data decoding circuit operable to decode the first set of M soft data values to yield a data output.

* * * * *